United States Patent
Jeon et al.

(10) Patent No.: US 11,656,990 B2
(45) Date of Patent: May 23, 2023

(54) MEMORY SYSTEM AND OPERATING METHOD THEREOF

(71) Applicant: SK hynix Inc., Icheon (KR)

(72) Inventors: Jeong Ho Jeon, Icheon (KR); Dal Gon Kim, Icheon (KR)

(73) Assignee: SK hynix Inc., Icheon (KR)

( * ) Notice: Subject to any disclaimer, the term of this patent is extended or adjusted under 35 U.S.C. 154(b) by 158 days.

(21) Appl. No.: 17/171,222

(22) Filed: Feb. 9, 2021

(65) Prior Publication Data

US 2022/0083470 A1 Mar. 17, 2022

(30) Foreign Application Priority Data

Sep. 11, 2020 (KR) .................. 10-2020-0116565

(51) Int. Cl.
| | | |
|---|---|---|
| *G06F 11/00* | (2006.01) | |
| *G06F 12/0804* | (2016.01) | |
| *G06F 11/10* | (2006.01) | |
| *G06F 9/4401* | (2018.01) | |
| *G06F 3/06* | (2006.01) | |
| *G06F 1/28* | (2006.01) | |
| *G06F 11/20* | (2006.01) | |
| *G06F 11/34* | (2006.01) | |

(52) U.S. Cl.
CPC ............ *G06F 12/0804* (2013.01); *G06F 1/28* (2013.01); *G06F 3/064* (2013.01); *G06F 3/0619* (2013.01); *G06F 3/0659* (2013.01); *G06F 3/0673* (2013.01); *G06F 9/4401* (2013.01); *G06F 11/1004* (2013.01); *G06F 11/2015* (2013.01); *G06F 11/3476* (2013.01); *G06F 2212/1032* (2013.01)

(58) Field of Classification Search
CPC ............ G06F 11/2015; G06F 11/3476; G06F 11/1004
USPC ........................................ 714/1–57
See application file for complete search history.

(56) References Cited

U.S. PATENT DOCUMENTS

| | | | | |
|---|---|---|---|---|
| 6,904,541 B1 * | 6/2005 | MacArthur | ......... | G06F 11/2015 714/22 |
| 7,085,962 B1 * | 8/2006 | Hamilton | ............ | G06F 11/1458 714/E11.121 |
| 2002/0126561 A1 * | 9/2002 | Roohparvar | ............. | G11C 5/14 365/226 |

(Continued)

FOREIGN PATENT DOCUMENTS

| KR | 20090129624 A | 12/2009 |
|---|---|---|
| KR | 20180076715 A | 7/2018 |

*Primary Examiner* — Sarai E Butler

(57) ABSTRACT

A memory system includes a memory device, a memory controller configured to control the memory device, and an auxiliary power source configured to supply power to the memory device and the memory controller. The memory controller activates the auxiliary power source in response to the occurrence an NPO (normal power-off) or an SPO (sudden power-off), checks whether there exists an uncompleted operation at a point of time at which the auxiliary power source is activated, and completes the uncompleted operation, and when an amount of residual energy of the auxiliary power source after completing the uncompleted operation exceeds a predetermined threshold value, performs a data verify operation for a predetermined area in the memory device and stores a result of the data verify operation in the memory device.

19 Claims, 10 Drawing Sheets

(56) References Cited

U.S. PATENT DOCUMENTS

| | | | | |
|---|---|---|---|---|
| 2002/0133735 A1* | 9/2002 | McKean | G06F 11/2092 | |
| | | | 714/5.11 | |
| 2003/0065983 A1* | 4/2003 | Miller | G06F 3/0613 | |
| | | | 711/112 | |
| 2003/0172325 A1* | 9/2003 | Wyatt | G06F 11/10 | |
| | | | 714/53 | |
| 2006/0062046 A1* | 3/2006 | Babudri | G06F 11/1417 | |
| | | | 714/E11.133 | |
| 2007/0280720 A1* | 12/2007 | Kimura | G03G 15/80 | |
| | | | 399/88 | |
| 2009/0031168 A1* | 1/2009 | Dart | G11C 29/02 | |
| | | | 714/E11.159 | |
| 2010/0064161 A1* | 3/2010 | Chen | G06F 11/1441 | |
| | | | 713/324 | |
| 2010/0146333 A1* | 6/2010 | Yong | G06F 1/305 | |
| | | | 713/340 | |
| 2010/0165811 A1* | 7/2010 | Bonvin | G11B 19/047 | |
| 2010/0251035 A1* | 9/2010 | Hasegawa | H04L 1/0061 | |
| | | | 714/49 | |
| 2011/0083039 A1* | 4/2011 | Kim | G06F 11/1048 | |
| | | | 714/E11.178 | |
| 2012/0198174 A1* | 8/2012 | Nellans | G06F 3/0655 | |
| | | | 711/E12.009 | |
| 2014/0320920 A1* | 10/2014 | Kitamura | H04N 1/21 | |
| | | | 358/1.15 | |
| 2015/0378886 A1* | 12/2015 | Nemazie | G06F 12/0238 | |
| | | | 711/103 | |
| 2019/0165963 A1* | 5/2019 | Waki | G06F 16/51 | |

\* cited by examiner

MEMORY SYSTEM AND OPERATING METHOD THEREOF

CROSS-REFERENCE TO RELATED APPLICATION

The present application claims priority under 35 U.S.C. § 119(a) to Korean Patent Application No. 10-2020-0116565 filed in the Korean Intellectual Property Office on Sep. 11, 2020, which is incorporated herein by reference in its entirety.

BACKGROUND

1. Technical Field

Various embodiments generally relate to a memory system and an operating method thereof, and more particularly, to a memory system and an operating method thereof, which have improved energy use efficiency and operational reliability.

2. Related Art

A memory system, particularly, a NAND flash-based semiconductor memory system may store large-capacity data with high performance at a reasonable cost.

The semiconductor memory system is vulnerable to data loss due to an unexpected power cut-off. Under normal circumstances, a host transmits a signal, indicating that power will be cut off, to the memory system prior to cutting off power, and cuts off power after receiving an ACK signal sent by the memory system (a normal power-off (NPO)). Before sending the ACK signal, the memory system completes an operation (a read, write (or program), or erase operation) that is being performed and stores all updated information relating to the operations of a nonvolatile memory. On the other hand, there is a case in which power is suddenly cut off without notifying the semiconductor memory system that power will be cut off. Such a sudden power cut-off without notification is called a sudden power-off (SPO).

The semiconductor memory system includes an auxiliary power source as a countermeasure against the SPO. When the SPO occurs, the semiconductor memory system completes an operation that is being performed, using the auxiliary power source, and stores data, stored in a buffer memory or a cache memory, in the nonvolatile memory. This may be referred to as a PLP (power loss protection) dump operation.

The conventional semiconductor memory system does not use any energy of the auxiliary power source when the NPO occurs. Also, even when the auxiliary power source has more energy than an amount of energy required for performing the PLP dump operation when the SPO occurs, the auxiliary power source is used to perform only the PLP dump operation. Therefore, the energy of the auxiliary power source is not efficiently used.

Further, the conventional semiconductor memory system does not implement a method for improving operational reliability using the auxiliary power source.

SUMMARY

Various embodiments are directed to a memory system capable of efficiently using the energy of an auxiliary power source when an NPO or an SPO occurs, thereby improving operational reliability.

In detail, various embodiments are directed to a memory system and an operation method thereof, capable of, when an NPO occurs, attempting data reading and error detection on a specific memory area using energy of an auxiliary power source and storing read count data reflecting the attempt, and capable of, when an SPO occurs, comparing a total amount of energy provided by the auxiliary power source and an amount of energy required for a PLP dump operation, attempting data reading and error detection on a corresponding memory area when it is determined that an extra amount of energy exists, and storing read count data reflecting the attempt in a flash memory.

However, technical problems to be solved by the disclosure are not limited to those described above, and other technical problems to be solved may exist within the scope of the technical idea described in the claims.

In an embodiment, a memory system may include: a memory device; a memory controller configured to control the memory device; and an auxiliary power source configured to supply power to the memory device and the memory controller, wherein the memory controller is configured to activate the auxiliary power source in response to the occurrence of an NPO (normal power-off) or an SPO (sudden power-off), check whether there exists an uncompleted operation at a point of time at which the auxiliary power source is activated, complete the uncompleted operation, and when an amount of residual energy of the auxiliary power source after completing the uncompleted operation exceeds a predetermined threshold value, perform a data verify operation for a predetermined area in the memory device and store a result of the data verify operation in the memory device.

The memory controller may determine that the SPO has occurred based on an externally supplied voltage that falls below a predetermined voltage level for a predetermined time period. Also, the memory controller may determine that the NPO has occurred after receiving a scheduled power cutoff notification signal from an external device and transmitting an acknowledgement signal to the external device.

The memory system may include a capacitor or a chemical cell.

The memory system may include a capacitor selected from a group consisting of a ceramic capacitor, a stack type ceramic capacitor, a high-k capacitor, an electrolytic capacitor, a tantalum polymer capacitor, and the like.

The memory system may set the predetermined voltage level to a predetermined percentage (for example, 80%) with respect to the externally supplied voltage supplied from the external device.

The memory system may check, when the amount of the residual energy of the auxiliary power source after the uncompleted operation is completed exceeds the predetermined threshold value, the amount of the residual energy of the auxiliary power source, and may determine a number of data verify operations to be performed based on the amount of the residual energy of the auxiliary power source.

The memory system may select the predetermined area in the memory device, from a user area of the memory device including the user area and a system area.

The memory system may select the predetermined area by a unit of a virtual super block, each virtual super block including at least N memory blocks among the plurality of memory blocks, N being a natural number equal to or greater than 2.

During the data verify operation, the memory system may read data stored in the predetermined area, perform an error detection operation on read data, update a read count data value of the predetermined area, and store a result of performing the error detection operation and an updated read count data value in the memory device.

The memory system may set the threshold value corresponding to an amount of energy required for the memory controller to perform the data verify operation.

The memory system may configure the memory device into a first memory area which is configured by memory cells each storing multi-bit data and a second memory area which is configured by memory cells each storing single-bit data, and may store the result of performing the error detection operation and the updated read count data value in the second memory area.

In an embodiment, a method for operating a memory system may include: activating an auxiliary power source in response to the occurrence of an NPO or an SPO; checking whether there exists an uncompleted operation at a point of time at which the auxiliary power source is activated, and completing the uncompleted operation; and using residual energy of the auxiliary power source after completing the uncompleted operation, an amount of the residual energy exceeding a predetermined threshold value, performing a data verify operation for a predetermined area in a memory device, and is storing information on a result of the data verify operation in the memory device.

In the method for operating a memory system, the activating of the auxiliary power source may include: determining that the SPO has occurred based on an externally supplied voltage that falls below a predetermined voltage level for a predetermined time period, or determining that the NPO has occurred after receiving a scheduled power cutoff notification signal from an external device and transmitting an acknowledgement signal to the external device.

In the method for operating a memory system, the auxiliary power source may include a capacitor or a chemical cell, and the capacitor may be selected from a group consisting of a ceramic capacitor, a stack type ceramic capacitor, a high-k capacitor, an electrolytic capacitor, a tantalum polymer capacitor, and the like.

In the method for operating a memory system, the storing of the information on the result of the data verify operation in the memory device may check the amount of the residual energy of the auxiliary power source that exceeds the predetermined threshold value, and may determine a number of data verify operation to be performed based on the amount of the residual energy of the auxiliary power source.

In the method for operating a memory system, the storing of the information on the result of the data verify operation in the memory device may include: reading data stored in the predetermined area; performing an error detection operation on read data; updating a read count data value for the predetermined area; and storing a result of performing the error detection operation and an updated read count data value in the memory device.

In the method for operating a memory system, as the predetermined threshold value, an amount of energy required for performing the data verify operation may be used.

In the method for operating a memory system, the memory device may include a first memory area which is configured by memory cells each storing multi-bit data and a second memory area which is configured by memory cells each storing single-bit data, and the result of performing the error detection operation and the updated read count data value may be stored in the second memory area.

In the method for operating a memory system, the data verify operation may include a read operation for reading hot data that is frequently accessed.

In an embodiment, a method for operating a memory system may further include: reading the information on the result of the data verify operation that is stored in the memory device in response to booting of the memory system; inspecting the read information to determine whether information on an error detection is included in the read information; temporarily storing, in another memory area of the memory device, data of the predetermined area upon determining of the error detection in the read information; erasing the data stored in the predetermined area; and moving back the temporarily stored data in the other memory area to the predetermined area.

The above-described means for solving problems are exemplary ones, and should not be construed as being intended to limit the disclosure. In addition to the above-described exemplary embodiments, there may be additional embodiments that can be readily understood by those of ordinary skill in the art within the scope of the claims, drawings and detailed description of the disclosure.

The memory system according to the embodiments of the disclosure may efficiently utilize the energy of an auxiliary power source when an NPO or an SPO occurs.

The memory system according to the embodiments of the disclosure may detect a read error by performing a data read operation utilizing the energy of the auxiliary power source when an NPO occurs, and may update and store read count data, thereby improving the operational reliability of the memory system.

Also, the memory system according to the embodiments of the disclosure may detect a read error by performing a data read operation utilizing the energy of the auxiliary power source in the case where the energy of the auxiliary power source exists even after a PLP dump when an SPO occurs, and may update and store read count data, thereby further improving the operational reliability of the memory system.

Effects to be achieved by the disclosure are not limited to those described above, and other effects may exist.

DETAILED DESCRIPTION

Hereinafter, embodiments of the present disclosure are described in detail with reference to the accompanying drawings. Throughout the specification, reference to "an embodiment," "another embodiment," or the like is not necessarily to only one embodiment, and different references to any such phrase are not necessarily to the same embodiment(s). The term "embodiments" when used herein does not necessarily refer to all embodiments.

Figure 1:
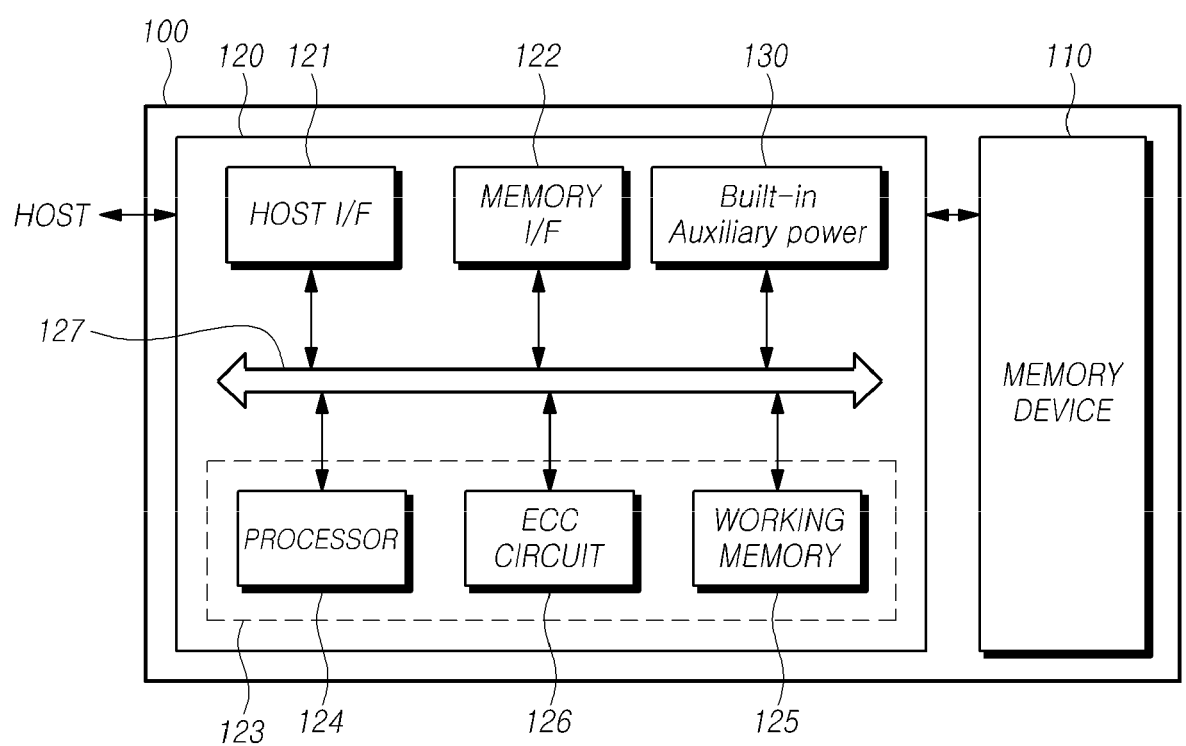
FIG. 1 is a block diagram schematically illustrating a memory system according to an embodiment of the present disclosure.

FIG. 1 illustrates a memory system 100 according to an embodiment of the present disclosure.

Referring to FIG. 1, the memory system 100 may include a memory device 110 configured to store data, and a memory controller 120 configured to control the memory device 110.

The memory device 110 may include multiple memory blocks. The memory device 110 may be configured to operate in response to control signals received from the memory controller 120. Operations of the memory device 110 may include, for example, a read operation, a program operation (also referred to as a "write operation"), an erasure operation, and the like.

The memory device 110 may include a memory cell array including multiple memory cells (also simply referred to as "cells") configured to store data. The memory cell array may exist inside a memory block.

For example, the memory device 110 may be implemented as any of various types of memories such as a double data rate synchronous dynamic random access memory (DDR SDRAM), a low power double data rate4 (LPDDR4) SDRAM, a graphics double data rate (GDDR) SDRAM, a low power DDR (LPDDR), a Rambus dynamic random access memory (RDRAM), a NAND flash memory, a vertical NAND flash memory, a NOR flash memory, a resistive random access memory (RRAM), a phase-change random access memory (PRAM), a magnetoresistive random access memory (MRAM), a ferroelectric random access memory (FRAM), a spin transfer torque random access memory (STT-RAM), and so on.

The memory device 110 may be implemented in a three-dimensional array structure. Embodiments of the present disclosure are applicable not only to a flash memory device having an electric charge storage layer configured as a conductive floating gate, but also to a flash memory device having a charge trap flash (CTF) having an electric charge storage layer configured as an insulating film.

The memory device 110 may be configured to receive a command and an address from the memory controller 120 and to access an area of the memory cell array that is selected by the address. That is, the memory device 110 may perform an operation corresponding to the received command in a memory area of the memory device 110 that is designated by a physical address corresponding to the received address.

For example, the memory device 110 may perform a program operation, a read operation, an erase operation, and the like. During the program operation, the memory device 110 may program data in the memory area selected by the received address. During the read operation, the memory device 110 may read data from the memory area selected by the received address. During the erase operation, the memory device 110 may erase data stored in the memory area selected by the received address.

The memory controller 120 may control write (or program), read, erase, and background operations with regard to the memory device 110. The background operation may be, for example, a garbage collection (GC) operation, a wear leveling (WL) operation, a bad block management (BBM) operation, or the like.

The memory controller 120 may control the operation of the memory device 110 in response to a request of a host. Alternatively, the memory controller 120 may control the operation of the memory device 110 without a request of the host. For example, when the memory device 110 performs one or more background operations, the memory controller 120 may control the one or more background operations without a request of the host.

The memory controller 120 and the host may be separate devices. In another embodiment, the memory controller 120 and the host may be integrated and implemented as a single device. In the following description, the memory controller 120 and the host are separate devices.

The memory controller 120 may include a host interface (I/F) 121, a memory interface (I/F) 122, and a control circuit 123.

The host interface 121 may be configured to provide an interface for communication with the host.

When receiving a request from the host, the control circuit 123 may receive the request through the host interface 121 and may perform an operation of processing the received request.

The memory interface 122 may be configured to provide an interface for communication with the memory device 110. That is, the memory interface 122 may be configured to provide the memory device 110 and the memory controller 120 with an interface under the control of the control circuit 123.

The control circuit 123 may be configured to control the operation of the memory device 110 by performing operations for overall control of the memory controller 120. For example, the control circuit 123 may include a processor 124 and a working memory 125. The control circuit 123 may further include an error detection and correction (detection/correction) circuit (i.e., ECC circuit) 126.

The processor 124 may control the overall operation of the memory controller 120. The processor 124 may perform a logical operation. The processor 124 may communicate with the host through the host interface 121. The processor 124 may communicate with the memory device 110 through the memory interface 122.

The processor 124 may perform a function of a flash translation layer (FTL). The processor 124 may translate a logical block address (LBA) provided by the host into a physical block address (PBA) through the FTL. The FTL may receive the LBA and translate the LBA into the PBA by using a mapping table.

There are various address mapping methods, which may be employed by the FTL, according to a mapping unit. Typical address mapping methods include a page mapping method, a block mapping method, and a hybrid mapping method.

The processor 124 may be configured to randomize data received from the host. For example, the processor 124 may randomize the data received from the host by using a randomizing seed. The randomized data is provided to the memory device 110 as data to be stored, and is programmed in the memory cell array of the memory device 110.

The processor 124 may be configured to derandomize data received from the memory device 110 during a read operation. For example, the processor 124 may derandomize the data received from the memory device 110 by using a derandomizing seed. The derandomized data may be output to the host.

The processor 124 may execute firmware (FW) to control the operation of the memory controller 120. In other words, the processor 124 may control the overall operation of the memory controller 120 and may execute (or drive) the firmware that is loaded into the working memory 125 during booting the memory system 100.

The firmware refers to a program executed inside the memory system 100, and may include various functional layers.

For example, the firmware may include a flash translation layer (FTL), a host interface layer (HIL), and/or a flash interface layer (FIL). The flash translation layer is configured to perform a translation operation between a logical address provided by the host and a physical address of the memory device 110. The host interface layer is configured to interpret a request that the host issues to the memory system 100 and to deliver the interpreted result to the FTL. The flash interface layer is configured to deliver a command issued by the FTL to the memory device 110.

For example, the firmware may be stored in the memory device 110, and then loaded into the working memory 125.

The working memory 125 may store firmware, program codes, commands, or pieces of data to drive the memory controller 120. The working memory 125 may include a volatile memory, for example, a static RAM (SRAM), a dynamic RAM (DRAM), a synchronous RAM (SDRAM), or the like.

The error detection/correction circuit 126 may be configured to detect error bit(s) of target data by using an error correction code, and to correct the detected error bit(s). For example, the target data may be data stored in the working memory 125, data retrieved from the memory device 110, or the like.

The error detection/correction circuit 126 may be implemented to decode data by using the error correction code. The error detection/correction circuit 126 may be implemented by using various code decoders. For example, the error detection/correction circuit 126 may use a decoder that performs nonsystematic code decoding or a decoder that performs systematic code decoding.

For example, the error detection/correction circuit 126 may detect error bit(s), sector by sector, with regard to each piece of read data from the memory device 110. That is, each piece of read data may include multiple sectors. As used herein, a sector may refer to a data unit smaller than a read unit (e.g., page) of a flash memory. Sectors constituting each piece of read data may be related to each other through addresses.

The error detection/correction circuit 126 may calculate a bit error rate (BER) and determine whether or not error correction can be made, sector by sector. For example, if a BER for a sector is higher than a reference value, the error detection/correction circuit 126 may determine that the corresponding sector is uncorrectable or failed. If the BER is lower than or equal to the reference value, the error detection/correction circuit 126 may determine that the corresponding sector is correctable or passed.

The error detection/correction circuit 126 may perform error detection and correction operations successively with regard to all pieces of read data. When a sector in the read data is correctable, the error detection/correction circuit 126 may omit the error detection and correction operations related to the corresponding sector with regard to the next piece of read data. After finishing the error detection and correction operations with regard to all pieces of read data in this manner, the error detection/correction circuit 126 may detect a sector deemed uncorrectable to the end. If there are one or more sectors deemed uncorrectable, the error detection/correction circuit 126 may deliver information (for example, address information) regarding the sectors deemed uncorrectable to the processor 124.

A bus 127 may be configured to provide a channel between the constituent elements 121, 122, 124, 125, and 126 of the memory controller 120. The bus 127 may include, for example, a control bus for delivering various types of control signals and commands, and a data bus for delivering various types of data.

The memory controller 120 may further include an auxiliary power source 130. The auxiliary power source 130 may include a chemical cell (a secondary battery) or a capacitor. The capacitor is preferred when considering mounting to the memory system 100, and a type of the capacitor is not particularly limited as long as the capacitor can supply power when an NPO or an SPO occurs. The capacitor may be selected from a group consisting of a ceramic capacitor, a stack type ceramic capacitor, a high-k capacitor, an electrolytic capacitor, and a tantalum polymer capacitor. However, embodiments are not limited thereto.

In an embodiment, the capacitor may be the tantalum polymer capacitor which adopts a tantalum anode and a polymer cathode having high conductivity. The tantalum polymer capacitor is preferred because of its larger power capacity in the same area than the ceramic capacitor. As the chemical cell, one or more of lithium ion, lithium ion polymer, nickel hydrogen, and nickel cadmium secondary batteries may be used.

The above-mentioned constituent elements 121, 122, 124, 125, and 126 of the memory controller 120 are only provided as examples. The above-mentioned constituent elements may be omitted from the memory controller 120, and/or one or more of the above-mentioned constituent elements may be integrated into a single element. In addition, in some cases, one or more other constituent elements may be added to the memory controller 120 in addition to the above-mentioned constituent elements of the memory controller 120.

Hereinafter, the memory device 110 of FIG. 1 will be described in more detail with reference to FIG. 2.

Figure 2:
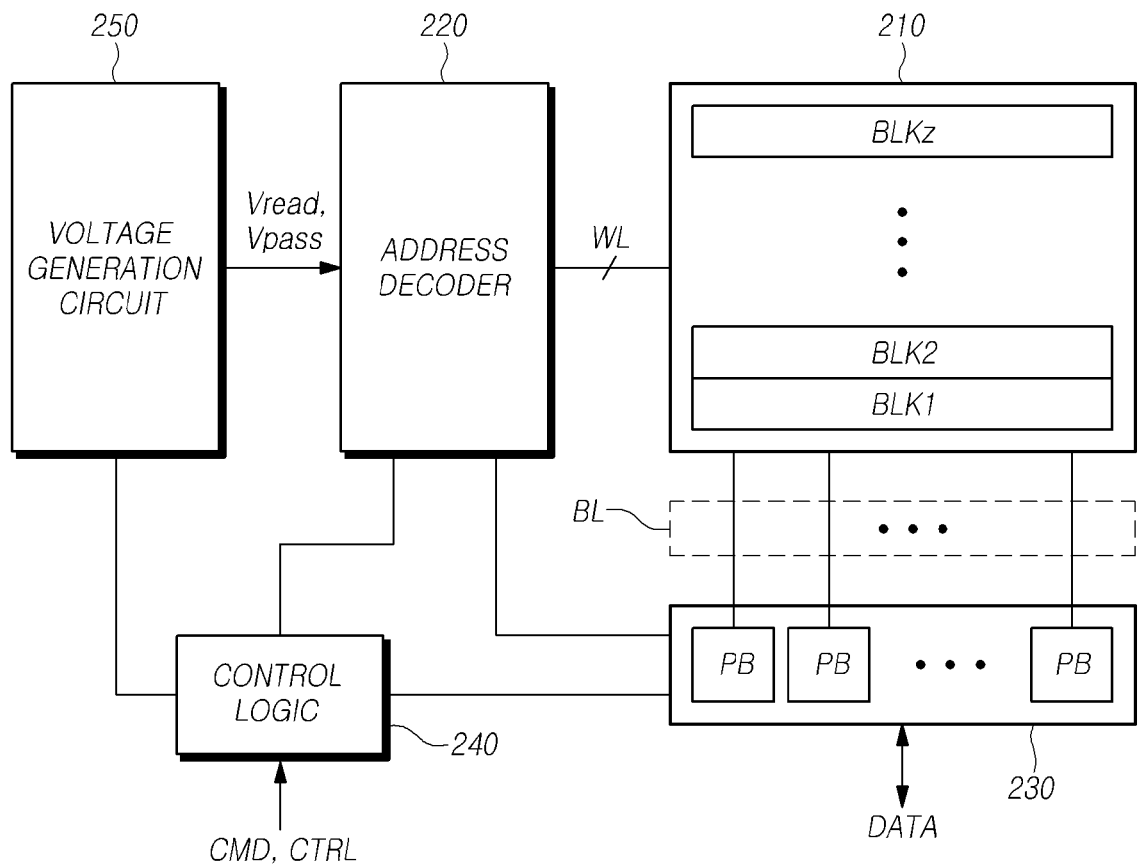
FIG. 2 is a block diagram schematically illustrating a memory device according to an embodiment of the present disclosure.

FIG. 2 is a block diagram schematically illustrating the memory device 110 of FIG. 1 according to an embodiment of the present disclosure.

Referring to FIG. 2, the memory device 110 may include a memory cell array 210, an address decoder 220, a read and write (read/write) circuit 230, control logic 240, and a voltage generation circuit 250.

The memory cell array 210 may include multiple memory blocks BLK1-BLKz, where z is a natural number greater than 2.

In the multiple memory blocks BLK1-BLKz, multiple word lines WL and multiple bit lines BL may be disposed, and multiple memory cells MC may be arranged.

The multiple memory blocks BLK1-BLKz may be connected to the address decoder 220 through the multiple word lines WL. The multiple memory blocks BLK1-BLKz may be connected to the read/write circuit 230 through the multiple bit lines BL.

Each of the multiple memory blocks BLK1-BLKz may include multiple memory cells. For example, the multiple memory cells may be nonvolatile memory cells, and the nonvolatile memory cells may have a vertical channel structure.

The memory cell array 210 may have a two-dimensional structure or a three-dimensional structure.

Each of the multiple memory cells in the memory cell array 210 may store at least one bit of data. For example, each of the multiple memory cells in the memory cell array 210 may be a single-level cell (SLC) configured to store one bit of data, a multi-level cell (MLC) configured to store two bits of data, a triple-level cell (TLC) configured to store three bits of data, or a quad-level cell (QLC) configured to store four bits of data. As another example, the memory cell array 210 may include multiple memory cells, each of which may be configured to store five or more bits of data.

The address decoder 220, the read/write circuit 230, the control logic 240, and the voltage generation circuit 250 may operate as a peripheral circuit configured to drive the memory cell array 210.

The address decoder 220 may be connected to the memory cell array 210 through the multiple word lines WL.

The address decoder 220 may be configured to operate under the control of the control logic 240.

The address decoder 220 may receive addresses through an input/output buffer inside the memory device 110. The address decoder 220 may be configured to decode a block address among the received addresses. The address decoder 220 may select at least one memory block in the memory cell array 210 according to the decoded block address.

The address decoder 220 may receive a read voltage Vread and a pass voltage Vpass from the voltage generation circuit 250.

During a read operation, the address decoder 250 may apply the read voltage Vread to a selected word line WL in a selected memory block, and may apply the pass voltage Vpass to the remaining non-selected word lines WL in the selected memory block.

During a program verification operation, the address decoder 220 may apply a verification voltage generated by the voltage generation circuit 250 to a selected word line WL in a selected memory block, and may apply the pass voltage Vpass to the remaining non-selected word lines WL in the selected memory block.

The address decoder 220 may be configured to decode a column address among the received addresses. The address decoder 220 may transmit the decoded column address to the read/write circuit 230.

The memory device 110 may perform the read operation and the program operation page by page. Addresses received when the read operation and the program operation are requested may include at least one of a block address, a row address, and a column address.

The address decoder 220 may select one memory block according to the block address and one word line according to the row address. The column address may be decoded by the address decoder 220 and provided to the read/write circuit 230.

The address decoder 220 may include a block decoder, a row decoder, a column decoder, and/or an address buffer.

The read/write circuit 230 may include multiple page buffers PB. The read/write circuit 230 may operate as a "read circuit" when the memory cell array 210 performs a read operation, and may operate as a "write circuit" when the memory cell array 210 performs a write (or program) operation.

The read/write circuit 230 may be referred to as a page buffer circuit including multiple page buffers PB, or a data register circuit. The read/write circuit 230 may include a data buffer that is used in a data processing function and, in some cases, may further include a cache buffer used in a caching function.

The multiple page buffers PB included in the read/write circuit 230 may be connected to the memory cell array 210 through the multiple bit lines BL, respectively. In order to sense a threshold voltage Vth of memory cells during a read operation and a program verification operation, the multiple page buffers PB may continuously supply a sensing current to the bit lines BL connected to the memory cells, may sense, at a sensing node, a change in an amount of current that flows through a corresponding bit line BL according to a program state of a corresponding memory cell, and may latch the sensed value as sensing data.

The read/write circuit 230 may operate in response to page buffer control signals output from the control logic 240.

During a read operation, the read/write circuit 230 senses data stored in a memory cell, temporarily stores the retrieved data, and outputs the stored data DATA to the input/output buffer of the memory device 110. In an embodiment, the read/write circuit 230 may include a column selection circuit in addition to the page buffers PB or page registers.

The control logic 240 may be connected to the address decoder 220, the read/write circuit 230, and the voltage generation circuit 250. The control logic 240 may receive a command CMD and a control signal CTRL through the input/output buffer of the memory device 110.

The control logic 240 may be configured to control the overall operation of the memory device 110 in response to the control signal CTRL. The control logic 240 may output a control signal for adjusting a pre-charge potential level of sensing nodes of the multiple page buffers PB.

The control logic 240 may control the read/write circuit 230 to perform a read operation in the memory cell array 210. The voltage generation circuit 250 may generate the read voltage Vread and the pass voltage Vpass, which are used during the read operation, in response to a voltage generation circuit control signal output from the control logic 240.

A memory block BLK in the memory device 110 may include multiple pages PG and multiple strings. The multiple pages PG correspond to the multiple word lines WL, and the multiple strings STR correspond to the multiple bit lines BL.

In the memory block BLK, the multiple word lines WL and the multiple bit lines BL may be arranged to intersect with each other. For example, each of the multiple word lines WL may be arranged in a row direction, and each of the multiple bit lines BL may be arranged in a column direction. As another example, each of the multiple word lines WL may be arranged in the column direction, and each of the multiple bit lines BL may be arranged in the row direction.

The multiple word lines WL and the multiple bit lines BL may intersect with each other, thereby defining multiple memory cells MC disposed at respective intersections of the multiple word lines WL and the multiple bit lines BL.

Each memory cell MC may include a transistor TR. For example, the transistor TR may include a drain, a source, and a gate. The drain (or source) of the transistor TR may be connected to a corresponding bit line BL directly or via another transistor TR. The source (or drain) of the transistor TR may be connected to a source line (which may be the ground) directly or via another transistor TR. The gate of the transistor TR may include a floating gate (FG) surrounded by an insulator, and a control gate (CG) to which a gate voltage is applied from a corresponding word line WL.

In each of the multiple memory blocks BLK1-BLKz in the memory cell array 210, a first selection line (also referred to as a source selection line or a drain selection line) may be additionally arranged outside the first outermost word line, which is closer to the read/write circuit 230, among two outermost word lines of the multiple word lines WL, and a second selection line (also referred to as a drain selection line or a source selection line) may be additionally arranged outside the second outermost word line, which is closer to the source line, among the two outermost word lines.

In some embodiments, at least one dummy word line may be additionally arranged between the first outermost word line and the first selection line. In addition, at least one dummy word line may be additionally arranged between the second outermost word line and the second selection line.

A read operation and a program operation (or write operation) of the memory block BLK may be performed page by page, and an erase operation of the memory cell array 210 may be performed memory block by memory block.

Figure 3:
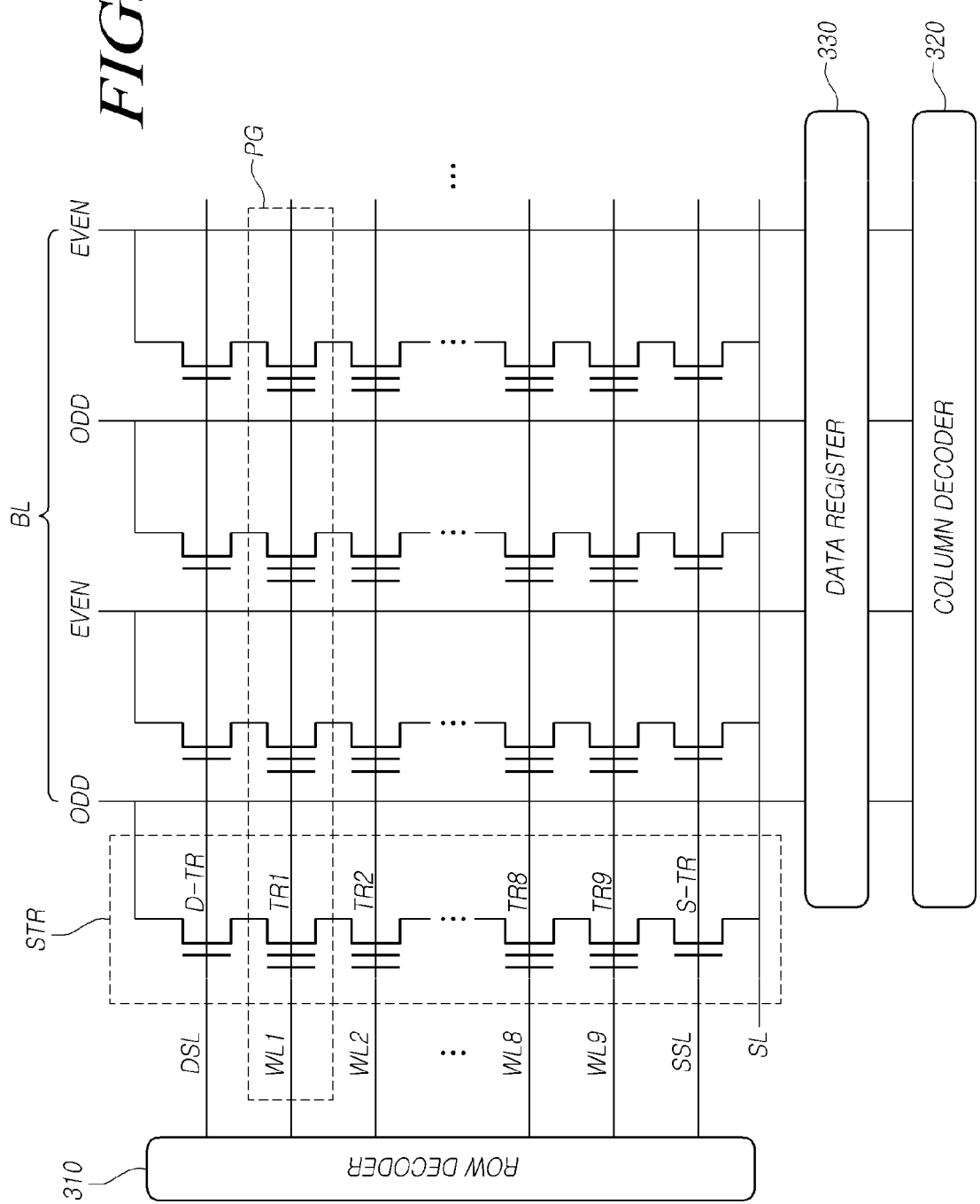
FIG. 3 is a diagram illustrating a structure of word lines and bit lines of a memory device according to an embodiment of the present disclosure.

FIG. 3 is a diagram illustrating a structure of word lines WL and bit lines BL of the memory device 110 of FIG. 2 according to an embodiment of the present disclosure.

Referring to FIG. 3, the memory device 110 includes a core area in which memory cells MC are disposed, and an peripheral area which corresponds to a non-core area. The peripheral area supports operations of the memory cell array 210 in the core area.

The core area may include multiple pages PG and multiple strings STR. In the core area, multiple word lines WL1-WL9 and multiple bit lines BL are arranged to intersect with each other.

The word lines WL1-WL9 may be connected to a row decoder 310. The bit lines BL may be connected to a column decoder 320. A data register 330, which corresponds to the read/write circuit 230 of FIG. 2, may be disposed between the multiple bit lines BL and the column decoder 320.

The multiple word lines WL1-WL9 may correspond to the multiple pages PG.

For example, each of the multiple word lines WL1-WL9 may correspond to one page PG as illustrated in FIG. 3. When each of the multiple word lines WL1-WL9 is significantly long, each of the multiple word lines WL1-WL9 may be divided into at least two sub-word lines and thus correspond to at least two (for example, two or four) pages PG respectively coupled to the at least two sub-word lines. Each page PG is the smallest unit in connection with conducting a program operation and a read operation, and all memory cells MC within the same page PG may simultaneously perform a corresponding operation when conducting a program operation or a read operation.

The multiple bit lines BL may be connected to the column decoder 320 and include odd-numbered bit lines BL and even-numbered bit lines BL.

For accessing a target memory cell MC, an address may be entered to the core area first through the input/output buffer and then through the row decoder 310 and the column decoder 320, such that the target memory cell MC can be designated. As used herein, designating the target memory cell MC refers to accessing one of the memory cells MC at the intersections of the word lines WL1-WL9 connected to the row decoder 310 and the bit lines BL connected to the column decoder 320.

Memory cells MC arranged in a first direction (for example, a horizontal direction with respect to the orientation of FIG. 3) are bound by a common line that is a word line WL and thus forms a page PG. Memory cells MC arranged in a second direction (for example, a vertical direction with respect to the orientation of FIG. 3) are bound (or connected) by a common line that is a bit line BL and thus forms a string STR. As used herein, commonly bound refers to structurally connected by the same material so that the commonly bound components simultaneously receive the same voltage during voltage application. Among voltages applied to memory cells MC connected in series in the first or second direction, a voltage applied to a memory cell MC disposed in a middle position may have a voltage level that is slightly different from a voltage applied to a memory cell MC disposed in the first position and a voltage applied to a memory cell MC disposed in the last position, due to a voltage drop across a preceding memory cell MC. For example, the memory cell MC disposed in the first position is closer to the voltage generation circuit 250 than the memory cell MC disposed in the middle position. The memory cell MC disposed in the middle position is closer to the voltage generation circuit 250 than the memory cell MC disposed in the last position.

The data register 330 plays an important role because all data processing executed by the memory device 110, including program and read operations, occurs via the data register 330. If data processing is delayed in the data register 330, all of the other circuits need to wait until the data register 330 finishes the data processing. Therefore, the delay in the data register 330 may degrade the overall performance of the memory device 110.

Referring to FIG. 3, in one string STR, multiple transistors TR1-TR9 may be connected to the multiple word lines WL1-WL9, respectively. The multiple transistors TR1-TR9 respectively correspond to multiple memory cells MC. In this example, each of the s multiple transistors TR1-TR9 includes a control gate CG and a floating gate FG.

The multiple word lines WL1-WL9 include two outermost word lines WL1 and WL9 disposed adjacent to both opposite ends of the string STR. A first selection line DSL may be additionally arranged outside the first outermost word line WL1, which is closer to the data register 330 in terms of a signal path among the two outermost word lines WL1 and WL9. A second selection line SSL may be additionally arranged outside the second outermost word line WL9.

A first selection transistor D-TR, which is turned on/off in response to a voltage of the first selection line DSL, has a gate electrode connected to the first selection line DSL, but includes no floating gate FG. A second selection transistor S-TR, which is turned on/off in response to a voltage of the second selection line SSL, has a gate electrode connected to the second selection line SSL, but includes no floating gate FG.

The first selection transistor D-TR plays the role of a switch that turns on or off the connection between the corresponding string STR and the data register 330. The second selection transistor S-TR plays the role of a switch that turns on or off the connection between the corresponding string STR and the source line SL. That is, the first selection transistor D-TR and the second selection transistor S-TR play the role of gatekeepers which are positioned at both opposite ends of the corresponding string STR to deliver or block signals.

During a program operation, the memory system 100 programs the target memory cell MC by connecting the target memory cell MC to the bit line BL so that the target memory cell MC is filled with electrons. Accordingly, the memory system 100 applies a turn-on voltage Vcc to the gate electrode of the first selection transistor D-TR, thereby turning on the first selection transistor D-TR, and applies a turn-off voltage (for example, 0V) to the gate electrode of the second selection transistor S-TR, thereby turning off the second selection transistor S-TR.

The memory system 100 turns on both of the first and second selection transistors D-TR and S-TR during a read operation or a program verification operation. Accordingly, during the read operation or the program verification operation, a current may flow through the corresponding string STR and drain to the source line SL, which corresponds to the ground, such that a voltage level of the bit line BL can be measured or sensed. However, during the read operation, there may be a time difference in the on/off timing between the first selection transistor D-TR and the second selection transistor S-TR.

The memory system 100 may supply a voltage (for example, +20V) to a substrate through the source line SL during an erase operation. The memory system 100 floats both the first selection transistor D-TR and the second selection transistor S-TR during the erase operation, thereby generating an infinite resistance. As a result, a switching role of the first selection transistor D-TR and that of the second selection transistor S-TR may be removed during the erasure operation, and electrons may operate only between a floating gate FG and the substrate due to a potential difference.

Figure 4:
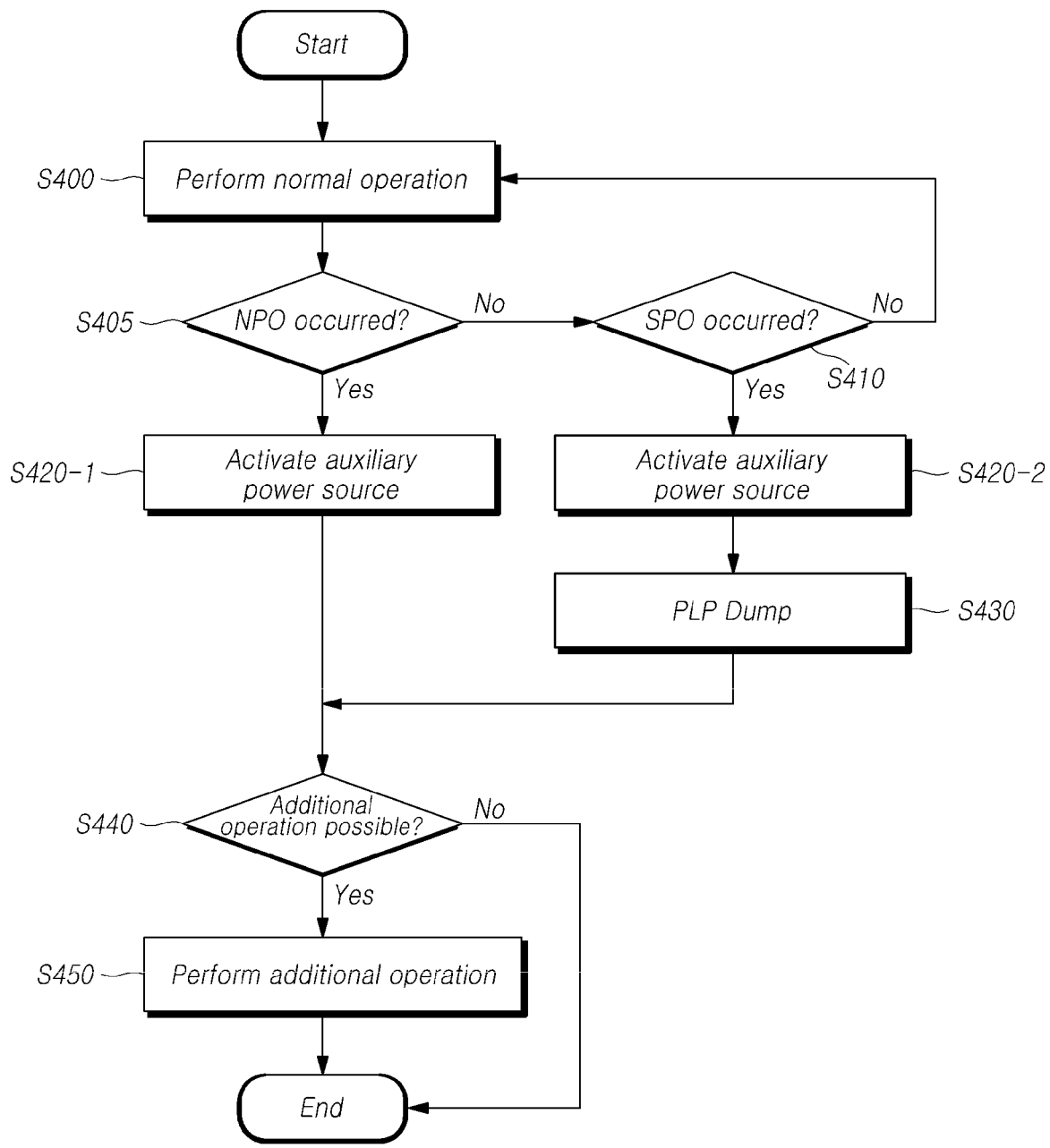
FIG. 4 is a flow chart illustrating an operation of the memory system of FIG. 1 in accordance with an embodiment of the present disclosure.
Figure 5A:
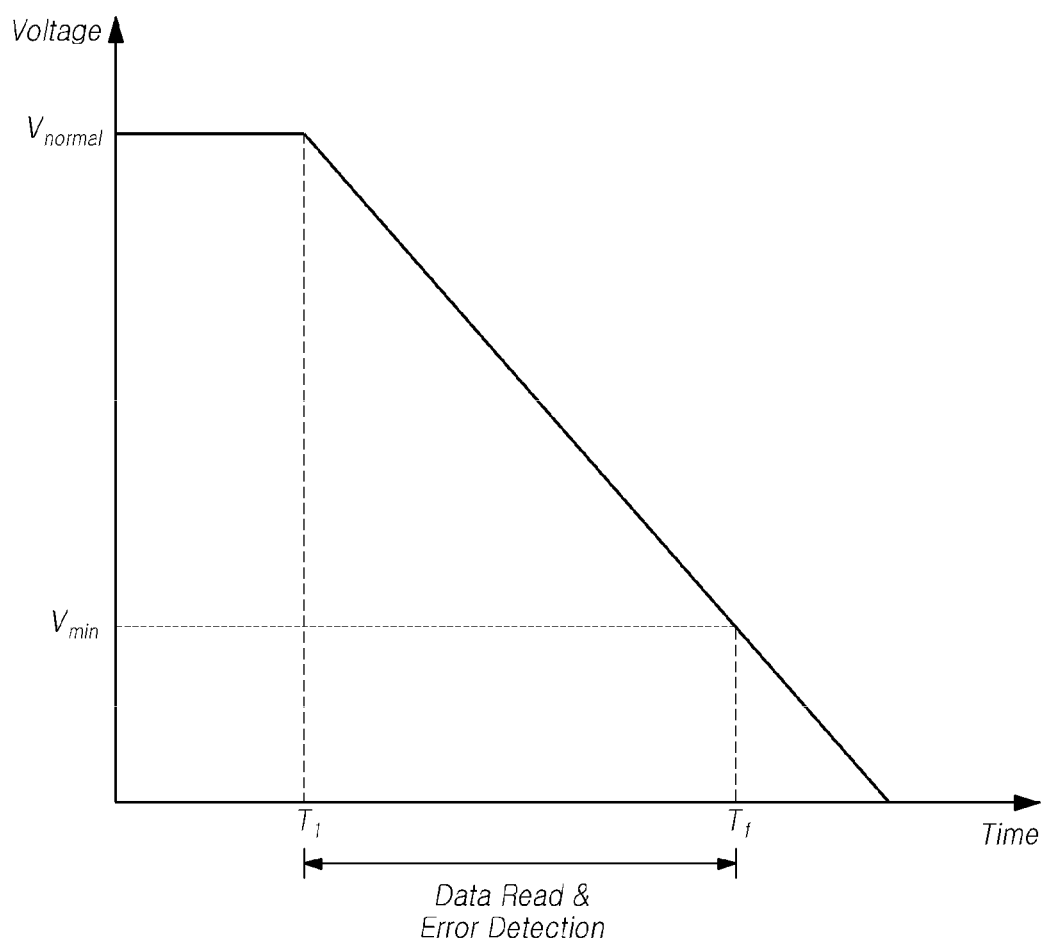
FIG. 5A is a diagram illustrating a voltage change of the memory system of FIG. 1 before and after an NPO occurs in accordance with an embodiment of the present disclosure.
Figure 5B:
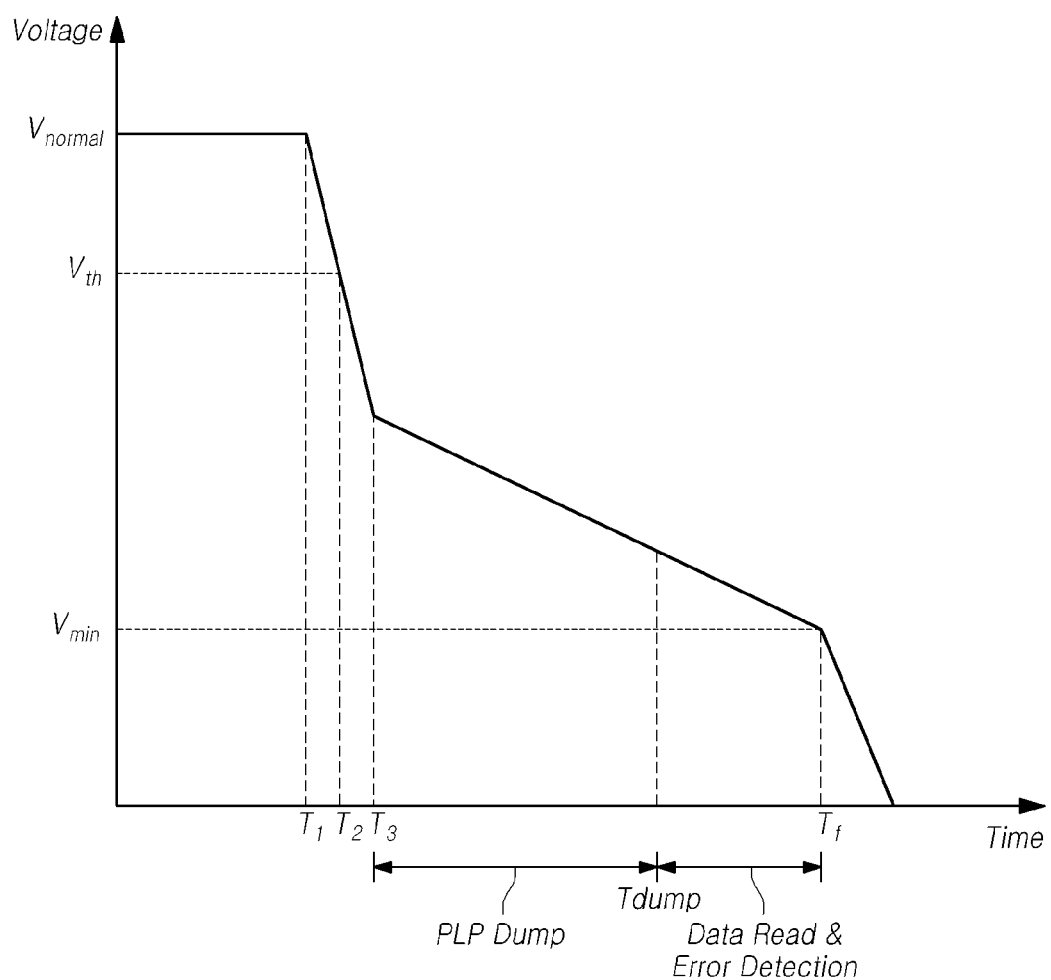
FIG. 5B is a diagram illustrating a voltage change of the memory system of FIG. 1 before and after an SPO occurs in accordance with an embodiment of the present disclosure.

FIG. 4 is a flow chart illustrating an operation of the memory system 100 of FIG. 1 when an NPO or an SPO occurs, FIG. 5A is a diagram illustrating a voltage change of the memory system 100 of FIG. 1 before and after the occurrence of the NPO, and FIG. 5B is a diagram illustrating a voltage change of the memory system 100 of FIG. 1 before and after the occurrence of the SPO.

At S400, the memory controller 120 performs a normal operation in which an address mapping operation is performed using a flash translation layer, and thus controls the normal operation such as a read operation, a program operation, an erase operation, a copy-back operation, a garbage collection operation, or a wear leveling operation for the memory device 110. These operations are performed in a state in which power is normally supplied to the memory system 100 (before a point of time $T_1$ in FIG. 5A or 5B).

When receiving, from the host, a signal indicating that externally inputted power will be cut off, the memory controller 120 completes all operations that are currently being performed, records updated information relating to the operations in the memory device 110, sends an ACK signal to the host, and then determines that the NPO has occurred at S405.

When it is determined at S405 that the NPO has occurred (Yes at S405), the memory controller 120 activates the auxiliary power source 130 at S420-1.

When the auxiliary power source 130 is activated at S420-1, a point of time at which a voltage of the memory system 100 falls below a minimum operating voltage $V_{min}$ is extended to a point of time $T_f$ in FIG. 5A or 5B. A time interval between the point of time $T_1$ and the point of time $T_f$ is proportional to the magnitude of an amount of energy held by the auxiliary power source 130. In the present embodiment, the amount of energy held by the auxiliary power source 130 is 100 mJ, and the time interval between the point of time $T_1$ and the point of time $T_f$ is 50 ms. This time interval may be extended as the capacity of the auxiliary power source 130 increases.

When it is determined at S405 that the NPO has not occurred (No at S405), the memory controller 120 determines whether the SPO has occurred by detecting a voltage drop at an input voltage supplied thereto at S410. The memory controller 120 determines that the SPO has occurred when a voltage drop of at least a predetermined value continues at the input voltage for a predetermined time (Yes at S410).

Referring to FIG. 5B, the memory controller 120 determines that the SPO has occurred when a state in which the input voltage has fallen from a normal voltage $V_{normal}$ to a threshold voltage $V_{th}$ and the voltage drop continues from a point of time $T_2$ to a point of time $T_3$. For example, the normal voltage $V_{normal}$ may be 5V, the threshold voltage $V_{th}$ may be 4V or 3.5V, and a time interval between the point of time $T_2$ and the point of time $T_3$ may be 1ns. A person of ordinary skill in the art may easily change the values of the normal voltage $V_{normal}$ and the threshold voltage $V_{th}$ and the time interval between the io point of time $T_2$ and the point of time $T_3$, in conformity with a given situation.

When there is no voltage drop or when a voltage drop does not continue for the predetermined time even though the voltage drop has occurred, the memory controller 120 determines that the SPO has is not occurred (No at S410), and returns to S400 to execute a request from the host. At S400, if there is no request from the host, the memory controller 120 may enter an idle state or perform a background operation such as garbage collection or wear leveling.

When it is determined at S410 that the SPO has occurred (Yes at S410), the memory controller 120 activates the auxiliary power source 130 at S420-2. As the auxiliary power source 130 is activated, a point of time at which the voltage of the memory system 100 falls below the minimum operating voltage $V_{min}$ is extended to the point of time $T_f$. The point of time $T_f$ follows the point of time $T_3$, and a time interval between the point of time $T_3$ and the point of time $T_f$ is proportional to the magnitude of the amount of energy held by the auxiliary power source 130. In the present embodiment, the amount of energy held by the auxiliary power source 130 is 100 mJ, and the time interval between the point of time $T_3$ and the point of time $T_f$ is 50 ms. This time interval may be extended as the capacity of the auxiliary power source 130 increases.

At S430, the memory controller 120 checks whether there exists an operation that started before the occurrence of the SPO (i.e., before the point of time $T_3$) but is uncompleted at the point of time $T_3$ at which it is determined that the SPO has occurred, and completes, when the uncompleted operation exists, the uncompleted operation. The operation performed by the memory controller 120 at S430 will be described below in detail with reference to FIG. 5B.

If the memory controller 120 is performing a data read operation at the point of time $T_3$, the memory controller 120 completes the data read operation, updates read count data stored in the working memory 125, and records the updated read count data in the memory device 110 during the time interval between the point of time $T_3$ and the point of time $T_f$. At this time, the memory controller 120 may also record, in the memory device 110, user data, an FTL table, and so forth stored in the working memory 125. The memory controller 120 completes such an operation at a point of time $T_4$ that does not exceed the point of time $T_f$.

If the memory controller 120 is performing a data write operation at the point of time $T_3$, the memory controller 120 performs the data write operation, thereby completing a write operation for the memory device 110. During the time interval between the point of time $T_3$ and the point of time $T_f$, the memory controller 120 may record, in the memory device 110, an LBA, an EEC, mapping data, ACK data confirming write completion, and so forth, which are additionally generated in the process of completing the data write operation. The memory controller 120 completes such an operation io at a point of time $T_5$ that does not exceed the point of time $T_f$. The memory controller 120 may transfer the ACK data, recorded in the memory device 110, to the host in a next booting process.

The memory controller 120 may be in an idle state at the point of time $T_3$. Even in this case, the memory controller 120 completes an operation of recording user data or metadata, stored in the working memory 125, in the memory device 110, before a point of time $T_6$ that does not exceed the point of time $T_f$. The points of time $T_4$ to $T_6$ are larger than the point of time $T_3$ and are smaller than the point of time $T_f$. In FIG. 5B, the points of time $T_4$ to $T_6$ are denoted as Tdump.

The memory controller 120 may handle an SPO occurrence situation by performing such an operation, thereby preserving user data and/or metadata related thereto and thus preventing data loss. This process is an example of a PLP (power loss protection) dump operation.

In the case of proceeding to S440 through the NPO detection process, i.e., when the NPO occurs, the memory controller 120 compares the point of time $T_1$ and the point of time $T_f$, and determines whether it is possible to perform an additional operation during a time interval between the point of time $T_1$ and the point of time $T_f$. Since the memory controller 120 does not perform the PLP dump operation when the NPO occurs, the memory controller 120 may determine that it is possible to perform an additional operation io using the energy stored in the auxiliary power source 130 that is prepared for the PLP dump operation, and may proceed to S450. For example, the memory controller 120 may determine that it is not possible to perform an additional operation, and end the process, only in an exceptional case such as a case where the NPO occurs in a state is in which the auxiliary power source 130 is not charged yet.

When proceeding to S440 through the SPO detection process, i.e., when the SPO occurs, the memory controller 120 compares a point of time (for example, the point of time Tdump) at which the PLP dump operation is completed with the point of time $T_f$, and determines whether it is possible to perform an additional operation after the PLP dump operation is completed. In the case where a long time is used for the PLP dump operation and thus the point of time Tdump is close to the point of time $T_f$, i.e., when there is no sufficient time left to perform an additional operation, the memory controller 120 determines at S440 that it is not possible to perform an additional operation, and ends the process.

When it is determined at S440 that a time interval between the point of time Tdump and the point of time $T_f$ is enough to perform an additional operation after completing the PLP dump operation, the memory controller 120 proceeds to S450 in order to perform an additional operation.

The additional operation may be, for example, a data verify operation for a specific area set in the memory device 110. The memory controller 120 may determine a range of the data verify operation depending on an amount of residual energy of the auxiliary power source 130. The range of the data verify operation may be the number of data verify operations capable of being performed with the amount of residual energy. The memory controller 120 may perform a more number of data verify operations when the amount of residual energy of the auxiliary power source 130 is larger.

At S450, as an example of the additional operation according to the present embodiment, the memory controller 120 may perform a data read and error detection operation for improving the operational reliability of the memory system 100.

Figure 6:
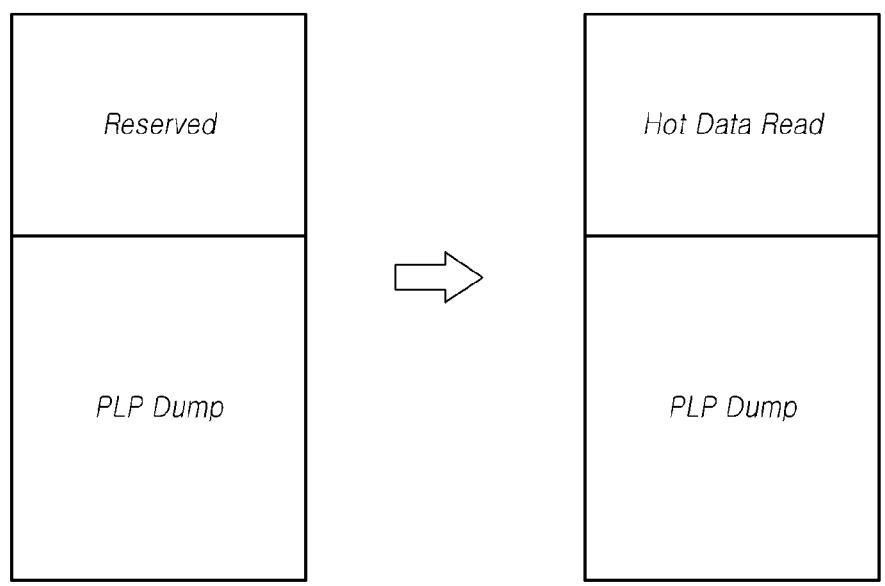
FIG. 6 is a diagram illustrating an operation of a memory controller of FIG. 1 in accordance with an embodiment of the present disclosure.
Figure 7:
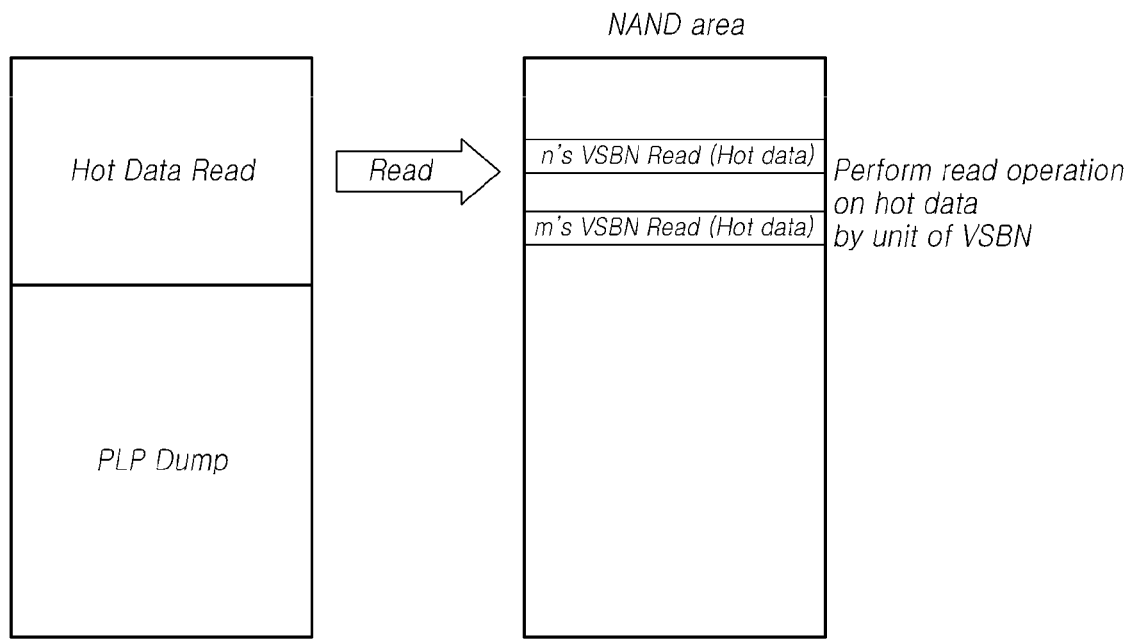
FIG. 7 is a diagram illustrating a hot data reading operation in accordance with an embodiment of the present disclosure.
Figure 8:
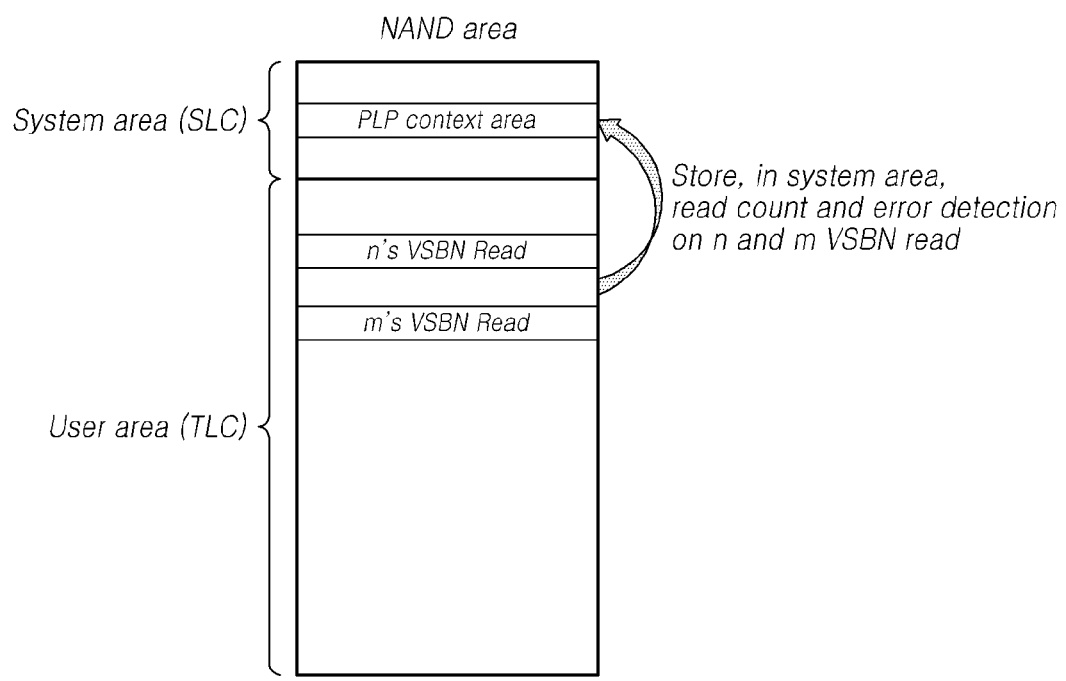
FIG. 8 is a diagram schematically illustrating a process in which the memory controller of FIG. 1 stores a hot data reading result in a memory device in accordance with an embodiment of the present disclosure.

FIGS. 6 to 8 are diagrams illustrating a data read and error detection operation.

FIG. 6 is a diagram illustrating an operation, performed by the memory controller 120, at S450 of FIG. 4, from an energy point of view. FIG. 6 illustrates a case where the auxiliary power source 130 can supply residual energy to the memory controller 120 even after the PLP dump operation is performed at S430, and FIGS. 7 and 8 illustrate the data read and error detection operation that is performed using the residual energy.

In FIG. 6, a part marked "Reserved" indicates an amount of the residual energy after performing the PLP dump operation. The amount of the residual energy may determine the time interval between the point of time Tdump and the point of time $T_f$. That is to say, the larger the amount of the residual energy is, the longer the time interval between the point of time Tdump and the point of time $T_f$.

FIGS. 7 and 8 illustrate that the data read and error detection operation is performed using the residual energy. However, embodiments are not limited thereto. In another embodiment, the memory controller 120 may perform a read reclaim or garbage collection operation using the residual energy to improve the reliability of the memory system 100. In this regard, as described above, which operation is to be performed by the memory controller 120 using the residual energy may be determined depending on the amount of the residual energy of the auxiliary power source 130.

FIG. 7 illustrates a hot data read operation as an example of the data read and error detection operation. For example, a page of the memory device 110 in which a music file frequently played, i.e., hot data, is stored has a larger read count data value than other pages in the memory device 110 in which data less frequently read is stored, and thus the page having the larger read count data value is highly likely to approach a threshold value that triggers a read reclaim operation. In this context, "hot data" is defined as data which is accessed more frequently than other data.

In an embodiment of the present disclosure, data stored in a page (or a memory block) whose read count data value is 50% or more of a value of triggering a read reclaim operation is used as hot data. If necessary, data stored in a page that is a target for wear leveling or garbage collection may be used as hot data, or data stored in a page (or a memory block) whose read count data value is 30% or more of the value of triggering the read reclaim operation may be used as hot data.

The memory controller 120 specifies hot data by referring to a read count data value stored in the working memory 125. Hot data may be designated by a unit of a page or a memory block of the memory device 110. In the present embodiment, hot data is read by a unit of a virtual super block (VSB) of the memory device 110. The virtual super block may be configured by collecting, for example, 2, 4, or 8 memory blocks. The virtual super block is identified by a virtual super block number (VSBN).

The memory controller 120 reads nth and mth virtual super blocks of the memory device 110, performs an error detection operation on data read from the nth and mth virtual super blocks, and updates read count data values of the nth and mth virtual super blocks. The number of virtual super blocks to be read by the memory controller 120 is proportional to the capacity of the residual energy (i.e., the time interval between the point of time Tdump and the point of time $T_f$ shown in FIG. 5B). The memory controller 120 determines whether an error exists in read data using ECC stored in a corresponding virtual super block. Since a method of generating an ECC or a technique of detecting and correcting an error using the ECC is known in the art, further description therefor is omitted.

The data read and error detection operation will be described below in terms of the amount of energy held by the auxiliary power source 130. For example, if the auxiliary power source 130 is configured with 10 capacitors coupled in parallel and the charging capacity of each capacitor is 800 uF, the total capacity of the auxiliary power source 130 becomes 8 mF. Therefore, when a voltage of 5V is applied to the auxiliary power source 130, an amount of energy held by the auxiliary power source 130 is calculated to be 100 mJ according to an equation: $E=\frac{1}{2}*C*V^2$ (E is energy, C is charging capacity, and V is applied voltage).

Among the amount of energy held by the auxiliary power source 130, i.e., 100 mJ, if energy of 60 mJ is used for the PLP dump operation due to the occurrence of the SPO, the remaining energy of 40 mJ may be used for performing the data read and error detection operation. When assuming that 20 mJ of the remaining energy of 40 mJ is used to store a result of the data read and error detection operation in the memory device 110, the remaining energy of 20 mJ may be used for performing the data read and error detection operation. In this case, for example, if energy of 10 mJ is required for performing one data read and error detection operation, two data read and error detection operations can be performed using the remaining energy of 20 mJ.

In the case of the NPO occurred, the memory controller 120 may use all energy of 100 mJ held by the auxiliary power source 130 for the data read and error detection operation. When assuming that 20 mJ of the energy of 100 mJ is used to store a result of the data read and error detection operation in the memory device 110, the remaining energy of 80 mJ may be used for the data read and error detection operation. In this case, for example, if energy of 20 mJ is required for performing one data read and error detection operation, four data read and error detection operations can be performed using the remaining energy of 80 mJ. It is obvious that energy used for one data read and error detection operation may be changed depending on a memory device.

In the above embodiment, the data read and error detection operation is performed on hot data. However, in another embodiment, the data read and error detection operation may be performed on data existing in a random area of the memory device 110.

FIG. 8 schematically illustrates a process in which the memory controller 120 stores a result of reading hot data in the memory device 110.

In order to increase data storage capacity, make read and write speeds faster, and safely protect important data, the memory device 110 may simultaneously include, in the memory cell array 210, a memory block for storing multi-bit data (hereinafter, referred to as a multi-bit block) and a memory block for storing single-bit data (hereinafter, referred to as a single-bit block). The multi-bit block may include memory cells such as MLCs, TLCs, or QLCs described above. The single-bit block may include SLCs described above.

The memory device 110 may be divided into a user area in which user data is stored and a system area in which system information related to an operation of the memory device 110 is stored. The system information may also be referred to as meta data or meta information.

In the memory system 100, the user area may be configured as a multi-bit block in order to store a large amount of user data, and the system area may be configured as a single-bit block in order to improve operational reliability and ensure a high-speed operation. In another embodiment, it is obvious to those of ordinary skill in the art that the memory device 110 may be configured by only single-bit blocks or by only multi-bit blocks.

The memory controller 120 may select a target area for performing the data read and error detection operation from the user area of the memory device 110. For example, the target area may be the nth and mth virtual super blocks of the user area.

The memory controller 120 stores, in the system area, results of reading data stored in the nth and mth virtual super blocks of the user area and performing the error detection operation on the read data. The results may include information on whether an error is detected in the read data of each of the nth and mth virtual super blocks, and read count data for each of the nth and mth virtual super blocks. In an embodiment of the present disclosure, the results may be stored in a PLP area in which PLP dump-related information is stored, the PLP area being included in the system area. In another embodiment, the results may be stored in an area other than the PLP area in the system area.

The data read and error detection operation will be described below in terms of time with reference to FIG. 5B again. It is assumed that the time interval between the point of time Tdump and the point of time $T_f$ is 20 ms, and that the memory controller 120 requires 5 ms to select one virtual super block, read data stored in the selected virtual super block, and perform the error detection operation on the read data of the one virtual super block, and requires 5 ms to store a result of performing the data read and error detection operation in the system area of the memory device 110.

The memory controller 120 recognizes that it is possible to perform an additional operation for 20 ms from the point of time Tdump, and performs the data read and error detection operation for two virtual super blocks during 20 ms since 10 ms is required for each virtual super block to perform the data read and error detection operation and store a result of performing the data read and error detection operation.

If the time interval between the point of time Tdump and the point of time $T_f$ is less than 10 ms as the PLP dump operation is delayed, the memory controller 120 determines that it is not possible to perform the data read and error detection operation during the time interval. If the time interval between the point of time Tdump and the point of time $T_f$ is equal to or longer than 10 ms and shorter than 20 ms, the memory controller 120 performs the data read and error detection operation for one virtual super block. The operation times 5 ms, 10 ms, and 20 ms described above in the embodiment are given as an example for the sake of convenience in explanation, and may be changed depending on a specific embodiment for implementing the spirit of the disclosure.

Figure 9:
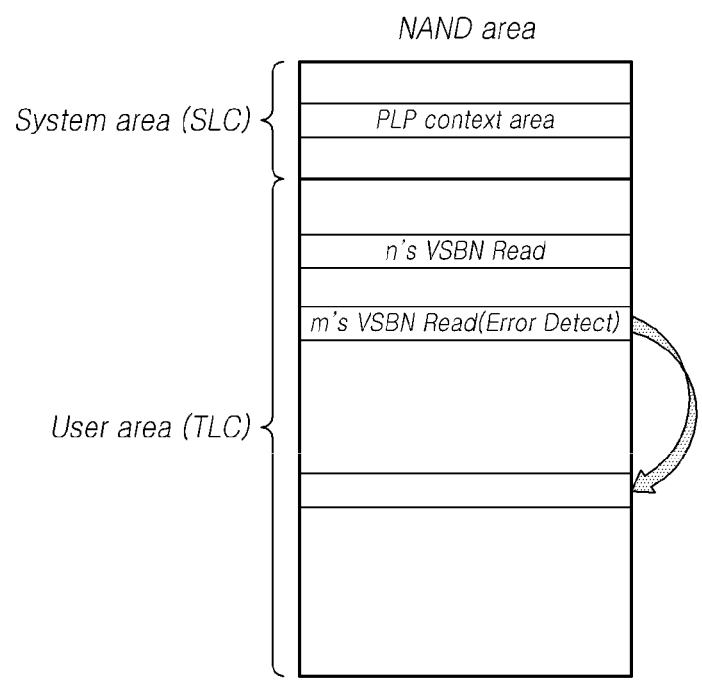
FIG. 9 is a schematic diagram illustrating a process in which the memory controller of FIG. 1 uses data in a system area of a memory device when normal power is first supplied after the occurrence of an SPO in accordance with an embodiment of the disclosure.

FIG. 9 is a schematic diagram illustrating a process of the memory controller 120 of FIG. 1 according to an embodiment. In the process shown in FIG. 9, the memory controller 120 uses data stored in the system area of the memory device 110 when normal power is first supplied after the occurrence of the SPO.

When the memory system 100 is booted as power is normally supplied thereto, the memory controller 120 reads data stored in the PLP area of the memory device 110 and stores the read data in the working memory 125, and then, inspects the read data to check read count data and to determine whether information on an error detection is included in the read data. In the present embodiment, the memory controller 120 inspects the read data from the PLP area, and confirms that no error was detected in data of the nth virtual super block and an error was detected in data of the mth virtual super block.

Accordingly, the memory controller 120 moves (programs) the data of the mth virtual super block, in which the error was detected, to another memory block, and initializes the read count data of the mth virtual super block. If the error detected in the data of the mth virtual super block is not hardware-related, i.e., if the error is not due to a defect of a memory cell itself in the mth virtual super block, the memory controller 120 may temporarily store the data of the mth virtual super block in another memory block, erase the data of the mth virtual super block, and then, move the temporarily stored data back to the mth virtual super block. Even in this case, the read count data of the mth virtual super block is initialized.

Even in the case where the read count data of the mth virtual super block is equal to or greater than a predetermined threshold value, the memory controller 120 may perform a moving operation in the same manner as in the case where an error was detected. In another embodiment of the present disclosure, when the predetermined threshold value is 10,000 and the read count data of the nth virtual super block reaches 10,000, the memory controller 120 may move the data of the nth virtual super block to another memory block and initialize the read count data of the nth virtual super block. The memory controller 120 may temporarily move the data of the nth virtual super block to another memory block, erase the data of the nth virtual super block, and then move the temporarily moved data back to the nth virtual super block. Even in this case, the read count data of the nth virtual super block is initialized.

According to the embodiment of the disclosure, when the SPO occurs, the memory controller 120 may perform the PLP dump operation using the energy supplied by the auxiliary power source 130. In the case where there remains enough energy in the auxiliary power source 130 even after the PLP dump operation is completed, the memory controller 120 updates error detection and read count data by reading hot data stored in a specific block or page in the memory device 110, stores the updated data in the system area of the memory device 110, and performs a block refresh operation based on the updated data, stored in the system area, when the memory system 100 is booted as normal power is supplied thereto again.

Therefore, the memory system 100 in accordance with the embodiment of the disclosure may efficiently use the energy of the auxiliary power source 130, and may improve the operational reliability thereof because the memory system 100 performs a refresh operation by figuring out a block in which a read error is likely to occur or is imminent to occur.

The foregoing description of the disclosure is intended for illustration, and it will be understood by those skilled in the art that the disclosure may be easily modified in other specific forms without changing the technical spirit or essential features of the disclosure. Therefore, it should be understood that the embodiments described above are exemplary in all respects and not restrictive. For example, each component described as a single type may be implemented in a distributed manner, and similarly, components described as distributed may be implemented in a combined form.

Although various embodiments of the present disclosure have been described for illustrative purposes, those skilled in the art will appreciate that various modifications, additions and substitutions are possible, without departing from the scope and spirit of the disclosure as disclosed in the accompanying claims. Therefore, embodiments of the present disclosure have been described for the sake of brevity and clarity. The scope of the present disclosure shall be construed on the basis of the accompanying claims in such a manner that all of the technical ideas included within the scope equivalent to the claims belong to the present disclosure.

What is claimed is:

1. A memory system, comprising:
    a memory device including a plurality of memory blocks;
    a memory controller configured to control the memory device; and
    an auxiliary power source configured to supply power to the memory device and the memory controller,
    wherein the memory controller is configured to:
    activate the auxiliary power source in response to an occurrence of an NPO (normal power-off) or an SPO (sudden power-off),
    check whether there exists an uncompleted operation at a point of time at which the auxiliary power source is activated, and complete uncompleted portions of the uncompleted operation using the power of the auxiliary power source, and
    when an amount of residual energy of the auxiliary power source after completing the uncompleted operation exceeds a predetermined threshold value, perform a data verify operation for a predetermined area in the memory device and store a result of the data verify operation in the memory device, using the residual energy.

2. The memory system of claim 1, wherein the memory controller determines that the SPO has occurred based on an externally supplied voltage that falls below a predetermined voltage level for a predetermined time period, or determines that the NPO has occurred after receiving a scheduled power cutoff notification signal from an external device and transmitting an acknowledgement signal to the external device.

3. The memory system of claim 2, wherein the predetermined voltage level is set to a predetermined percentage with respect to the externally supplied voltage supplied from the external device.

4. The memory system of claim 1, wherein
    the auxiliary power source comprises a capacitor or a chemical cell, and
    the capacitor is selected from a group consisting of a ceramic capacitor, a stack type ceramic capacitor, a high-k capacitor, an electrolytic capacitor, a tantalum polymer capacitor, and the like.

5. The memory system of claim 1, wherein, when the amount of the residual energy of the auxiliary power source after the uncompleted operation is completed exceeds the predetermined threshold value, the amount of the residual energy of the auxiliary power source is checked, and a number of data verify operations to be performed is determined based on the amount of the residual energy of the auxiliary power source.

6. The memory system of claim 1, wherein the predetermined area in the memory device is selected from a user area of the memory device, the memory device including the user area and a system area.

7. The memory system of claim 1, wherein the predetermined area is selected by a unit of a virtual super block, each virtual super block including at least N memory blocks among the plurality of memory blocks, N being a natural number equal to or greater than 2.

8. The memory system of claim 1, wherein, during the data verify operation, the memory controller reads data stored in the predetermined area, performs an error detection operation on read data, updates a read count data value of the predetermined area, and stores a result of performing the error detection operation and an updated read count data value in the memory device.

9. The memory system of claim 8, wherein the predetermined threshold value corresponds to an amount of energy required for the memory controller to perform the data verify operation.

10. The memory system of claim 9, wherein
the memory device comprises a first memory area, which is configured by memory cells each storing multi-bit data, and a second memory area, which is configured by memory cells each storing single-bit data, and the memory controller stores the result of performing the error detection operation and the updated read count data value in the second memory area.

11. A method for operating a memory system including a memory device, a memory controller configured to control the memory device, and an auxiliary power source configured to supply power to the memory device and the memory controller, the method performed under the control of the memory controller and comprising:
  activating the auxiliary power source in response to an occurrence of an NPO or an SPO;
  checking whether there exists an uncompleted operation at a point of time at which the auxiliary power source is activated, and completing uncompleted portions of the uncompleted operation using the power of the auxiliary power source; and
  using residual energy of the auxiliary power source after completing the uncompleted operation, an amount of the residual energy exceeding a predetermined threshold value, performing a data verify operation for a predetermined area in the memory device, and storing information on a result of the data verify operation in the memory device, using the residual energy.

12. The method of claim 11, wherein the activating of the auxiliary power source comprises:
  determining that the SPO has occurred based on an externally supplied voltage that falls below a predetermined voltage level for a predetermined time period, or determining that the NPO has occurred after receiving a scheduled power cutoff notification signal from an external device and transmitting an acknowledgement signal to the external device.

13. The method of claim 11, wherein the auxiliary power source comprises a capacitor or a chemical cell, and the capacitor is selected from a group consisting of a ceramic capacitor, a stack type ceramic capacitor, a high-k capacitor, an electrolytic capacitor, a tantalum polymer capacitor, and the like.

14. The method of claim 11, wherein the storing of the information on the result of the data verify operation in the memory device comprises checking the amount of the residual energy of the auxiliary power source that exceeds the predetermined threshold value, and determining a number of data verify operations to be performed based on the amount of the residual energy of the auxiliary power source.

15. The method of claim 11, wherein the storing of the information on the result of the data verify operation in the memory device comprises:
  reading data stored in the predetermined area;
  performing an error detection operation on read data;
  updating a read count data value for the predetermined area; and
  storing a result of performing the error detection operation and an updated read count data value in the memory device.

16. The method of claim 15, wherein the predetermined threshold value is an amount of energy required for performing the data verify operation.

17. The method of claim 15, wherein
the memory device comprises a first memory area, which is configured by memory cells each storing multi-bit data, and a second memory area, which is configured by memory cells each storing single-bit data, and
the storing of the result of performing the error detection operation and the updated read count data value in the memory device comprises storing the result of performing the error detection operation and the updated read count data value in the second memory area.

18. The method of claim 11, wherein the data verify operation includes a read operation for reading hot data that is frequently accessed.

19. The method of claim 11, further comprising:
  in response to booting of the memory system, reading the information on the result of the data verify operation that is stored in the memory device;
  inspecting the read information to determine whether information on an error detection is included in the read information;
  temporarily storing, in another memory area of the memory device, data of the predetermined area upon determining of the error detection in the read information;
  erasing the data stored in the predetermined area; and
  moving back the temporarily stored data in the other memory area to the predetermined area.

* * * * *